(12) United States Patent
Xu

(10) Patent No.: US 8,047,270 B2
(45) Date of Patent: Nov. 1, 2011

(54) HEAT DISSIPATION DEVICE HAVING HEAT PIPES FOR SUPPORTING HEAT SINK THEREON

(75) Inventor: Hong-Bo Xu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 976 days.

(21) Appl. No.: 11/967,065

(22) Filed: Dec. 29, 2007

(65) Prior Publication Data

US 2009/0166009 A1 Jul. 2, 2009

(51) Int. Cl.
*H05K 7/20* (2006.01)
(52) U.S. Cl. .................................. 165/104.33; 361/700
(58) Field of Classification Search ............. 165/104.33; 361/700

See application file for complete search history.

(56) References Cited

U.S. PATENT DOCUMENTS

| | | | | |
|---|---|---|---|---|
| 6,394,175 | B1 * | 5/2002 | Chen et al. | 165/104.33 |
| 6,958,915 | B2 * | 10/2005 | Wang et al. | 361/709 |
| 7,013,960 | B2 * | 3/2006 | Lee et al. | 165/104.33 |
| 7,028,758 | B2 * | 4/2006 | Sheng et al. | 165/104.33 |
| 2003/0019610 | A1 * | 1/2003 | Liu | 165/104.33 |
| 2004/0165350 | A1 * | 8/2004 | Fan | 361/700 |
| 2006/0120044 | A1 * | 6/2006 | Yu et al. | 361/695 |
| 2006/0238982 | A1 * | 10/2006 | Lee et al. | 361/700 |
| 2006/0262504 | A1 * | 11/2006 | Xia et al. | 361/700 |

* cited by examiner

*Primary Examiner* — Leonard Leo
(74) *Attorney, Agent, or Firm* — Altis Law Group, Inc.

(57) ABSTRACT

A heat dissipation device includes a base, a fin group located at a top of the base, a fan mounted on a top of the fin group, a first heat pipe and a second heat pipe. The first and second heat pipes connect with the base and the fin group and each includes a condensing portion and an evaporating portion. The evaporating portions of the first and second heat pipes are received in the base. The condensing portions of the first and the second heat pipes are located at opposite sides of the fin group respectively and extend through and support the fin group along opposite directions.

20 Claims, 4 Drawing Sheets

HEAT DISSIPATION DEVICE HAVING HEAT PIPES FOR SUPPORTING HEAT SINK THEREON

BACKGROUND OF THE INVENTION

1. Field of the Invention

The present invention relates to a heat dissipating device, more particularly to a heat dissipation device having heat pipes for supporting a heat sink thereon.

2. Description of Related Art

A computer central processing unit (CPU) is the core controller of electrical signals in the contemporary personal computers. Continued development of the CPUs has enabled them to perform more and more functions. Heat generated by the CPUs has thus increased enormously. Such heat can adversely affect the operational stability of the computers. Measures must be taken to efficiently remove the heat from the CPU. Typically, a dissipation device having great heat conductivity is mounted on the CPU to remove the heat therefrom.

The conventional heat dissipation device commonly comprises a base thermally connecting with the CPU, a plurality of fins mounted on a top of the base, a fan mounted on a top of the fins and a heat pipe connecting with the base and the CPU. The heat pipe comprises a condensing portion extending through and supporting the fins, an evaporating portion sandwiched between the base and the CPU. When the heat dissipation device works a long time, the heat pipe are deformed because of vibration and pressure via the fan and the fins. Thus, heat dissipation efficiency of the heat dissipation device is affected.

Thus, it is desired to devise a heat dissipating device which having a stable configuration.

SUMMARY OF THE INVENTION

A heat dissipation device includes a base, a fin group located at a top of the base, a fan mounted on a top of the fin group, a first heat pipe and a second heat pipe. The first and second heat pipes connect with the base and the fin group and each includes a condensing portion and an evaporating portion. The evaporating portions of the first and second heat pipes are received in the base. The condensing portions of the first and the second heat pipes are located at opposite sides of the fin group respectively and extend through and support the fin group along opposite directions.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
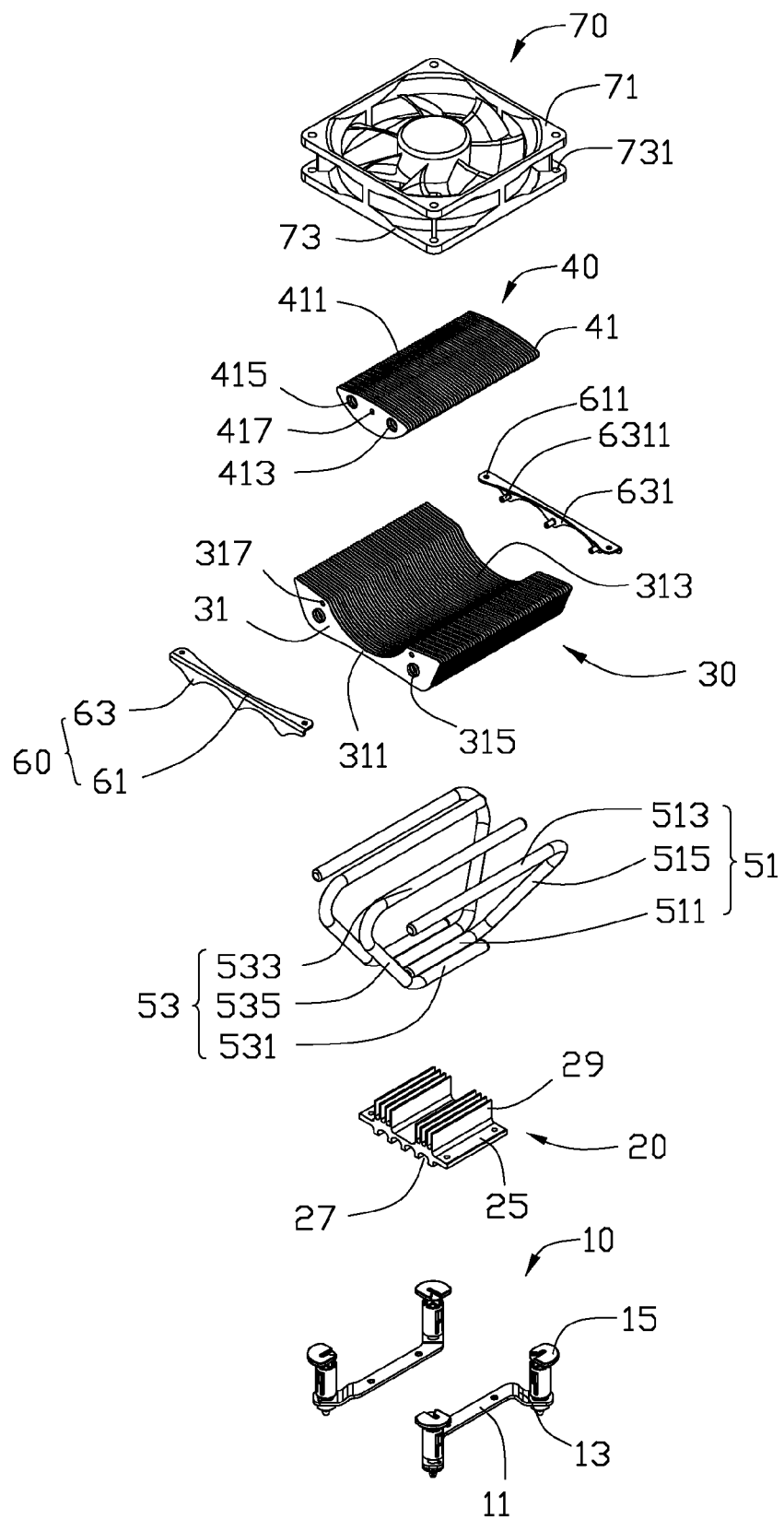
FIG. 1 is an exploded view of a heat dissipation device in accordance with a preferred embodiment of the present invention.
Figure 2:
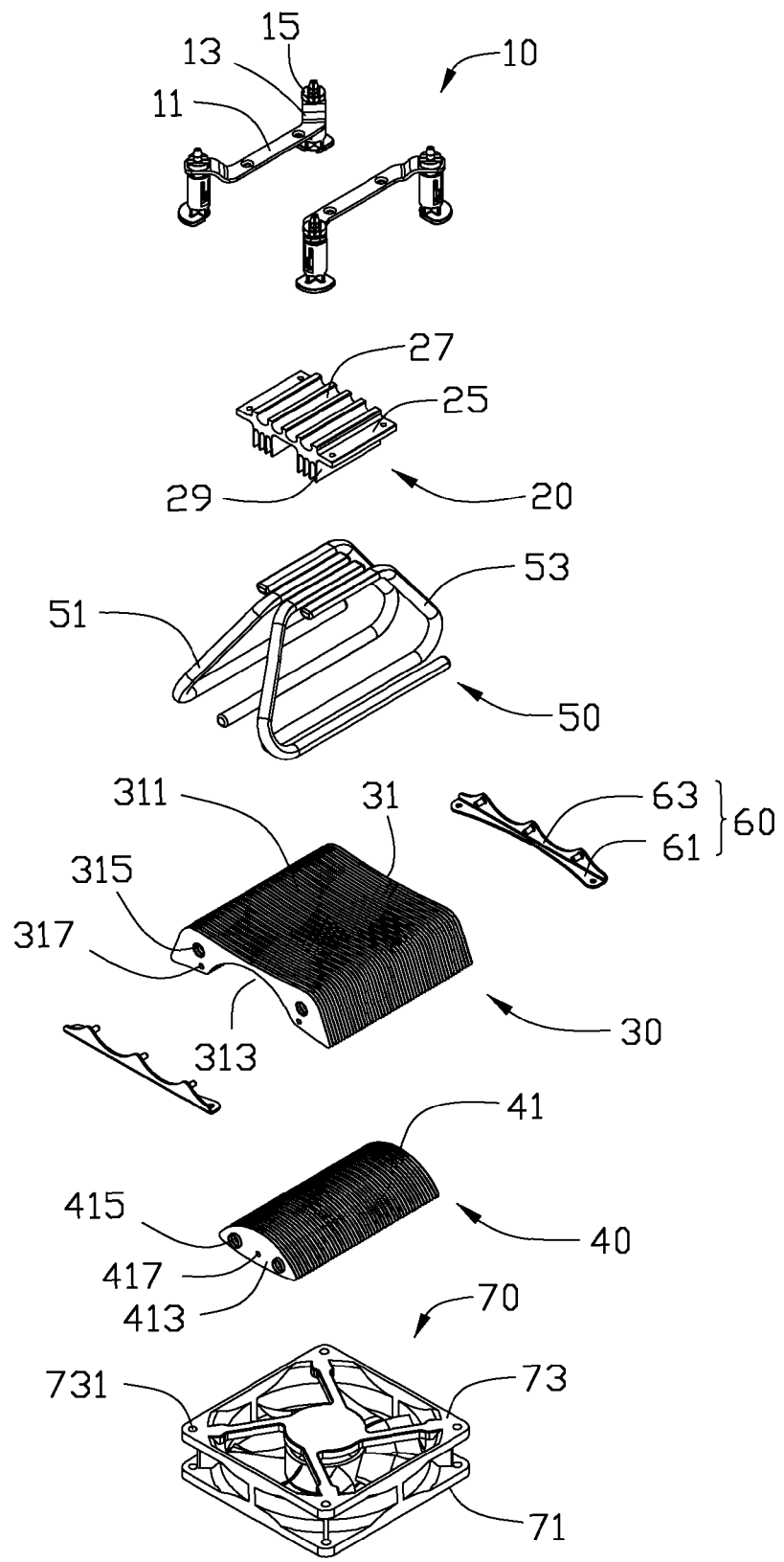
FIG. 2 is an inverted view of FIG. 1.

Referring to FIGS. 1-2 illustrate a heat dissipation device for dissipating heat generated by an electronic component (not shown) mounted on a printed circuit board (not shown). The heat dissipation device comprises a base 20 contacting with the electronic component, a fin group (not labeled) mounted above a top of the base 20, a heat pipe group 50 connecting with the base 20 and the fin group, a fan 70 mounted on a top of the fin group, a pair of fan holders 60 mounted on opposite sides of the fin group and two locking members 10 mounted on a bottom portion of the base 20 to secure the base 20 on the printed circuit board. The fin group comprises a first fin group 30 and a second fin group 40.

The heat pipe group 50 comprises a pair of first heat pipes 51 located at a front side of the fin group and a pair of second heat pipes 53 located at a rear side of the fin group.

Each first heat pipe 51 is U-shaped and comprises an evaporating portion 511, a condensing portion 513 and a connecting portion 515 interconnecting with the evaporating portion 511 and the condensing portion 513. The evaporating portion 511 is parallel to the condensing portion 513 and is shorter than the condensing portion 513. The evaporating portions 511 of the first heat pipes 51 are parallel to each other and received in the base 20. The condensing portions 513 of the first heat pipes 51 extend thought the first fin group 30 from the front side to the rear side of the fin group. A distance between the condensing portions 513 is large than a distance between the evaporating portions 511.

Each second heat pipe 53 is U-shaped and comprises an evaporating portion 531, a condensing portion 533 and a connecting portion 535 interconnecting with the evaporating portion 531 and the condensing portion 533. The evaporating portion 531 is parallel to the condensing portion 533 and is shorter than the condensing portion 533. The evaporating portions 531 of the first heat pipes 53 are parallel to each other and received in the base 20. The condensing portions 533 of the first heat pipes 53 extend thought the second fin group 40 from the rear side to the front side of the fin group. A distance between the condensing portions 533 is equal to a distance between the evaporating portions 531.

The first fin group 30 consists of a plurality of vertical fins 31. The fins 31 are parallel to each other and spaced from each other with a predetermined distance, thus a plurality of vertical airflow channels is defined between the fins 31. Bottom terminations of the fins 31 cooperatively define a flat bottom surface 311. Top terminations of the fins 31 are concaved toward a centre of the first fin group 30 to form a cupped portion 313 to receive the second fin group 40. Each fin 31 defines two through holes 315 at lateral sides of the cupped portion 313. The condensing portions 513 of the first heat pipes 51 extend through the through holes 315 and are soldered with the fins 31, thus, the first fin group 30 and the first heat pipes 51 are assembled together. Each a front end and a rear end of the first fin group 30 defines a pair of mounting holes 317 thereof to cooperate with the fan holders 60. Each mounting hole 317 is located at a top of a corresponding through hole 315 of the fin 31.

The second fin group 40 consists of a plurality of vertical fins 41. The fins 41 are parallel to each other and spaced from each other with a predetermined distance, thus a plurality of vertical airflow channels is defined between the fins 41. Top terminations of the fins 41 cooperatively define a flat top surface 411. Top terminations of the fins 41 are vaulted toward a centre of the second fin group 40 to form a protruding portion 413. The protruding portion 413 is received in the cupped portion 313 of the first fin group 30. Each fin 41 defines two through holes 415 at lateral sides of thereof. The condensing portions 533 of the second heat pipes 53 extend through the through holes 415 and are soldered with the fins 41, thus, the second fin group 40 and the second heat pipes 53 are assembled together. Each a front end and a rear end of the second fin group 40 defines a mounting hole 417 thereof to cooperate with the fan holders 60. The mounting hole 417 is located between the corresponding through holes 415.

The base 20 is located at a bottom of the first fin group 30 and spaced from the first fin group 30. The base 20 is substantially rectangular and made of high degree of heat conductivity metal such as copper or aluminum. A bottom portion (not labeled) of the base 20 defines four grooves 27 along a transverse direction. The grooves 27 are spaced from and parallel to each other. The evaporating portions 511 of the first heat pipes 51 are received in the grooves 27 located at a centre of the base 20 and the evaporating portions 531 of the second pipes 53 are received in the grooves 27 located at lateral sides of the base 20. The evaporating portions 531, 511 and a bottom surface of the base 20 are coplanar. Two locking portions 25 are formed at the lateral sides of the base 20, for engaging with the locking members 10 to mount the heat dissipation device on the printed circuit board. A plurality of fins 29 extends upwardly from a top surface (not labeled) of the base 20. A distance is exist between a top of the fins 29 and a bottom surface of the first fin group 30.

Each fan holder 60 is a bent metal sheet and comprises a horizontal arc-shaped supporting plate 61 and a mounting plate 63 extending downwardly from an edge of the supporting plate 61. The opposite ends of the supporting plate 61 define two mounting holes 611 to cooperate with the fan 70. The mounting plate 63 comprises three triangular bulges 631, corresponding to the mounting holes 317, 417 of the first and second fin groups 30, 40. Each bulge 631 has a pole 6311 extending toward the first fin group 30. The poles 6311 extend into the mounting holes 317, 417 of the first and second fin group 30, 40 to mount the fan holders 60 on the fin group. The first and second fin groups 30, 40 are connected together via the fan holders 60.

The fan 70 has a rectangular configuration and comprises a top flange 71 and a bottom flange 73. The bottom flange 73 has four corners. Each corner of the bottom flange 73 defines a mounting hole 731 aligned with the mounting hole 611 of the fan holder 70. Four screws (not labeled) extend through the mounting holes 731 of the fan 70 and the mounting holes 611 of the fan holders 60 to mount the fan 70 on the fan holders 60.

Each locking member 10 comprises a locking lever 11 engaging with the corresponding locking portion 25 of the base 20 and two legs 13 extending outwardly from opposite ends of the locking lever 11 and angled with the locking lever 11. Screws (not labeled) extend through the locking levers 11 and the locking portions 25 of the base 20 to secure the locking members 10 to the bottom of the locking portions 25. Four fasteners 15 extend through the legs 13 of the locking member 10 to be engaged with the printed circuit board to thereby mount the heat dissipation device to the printed circuit board.

Figure 3:
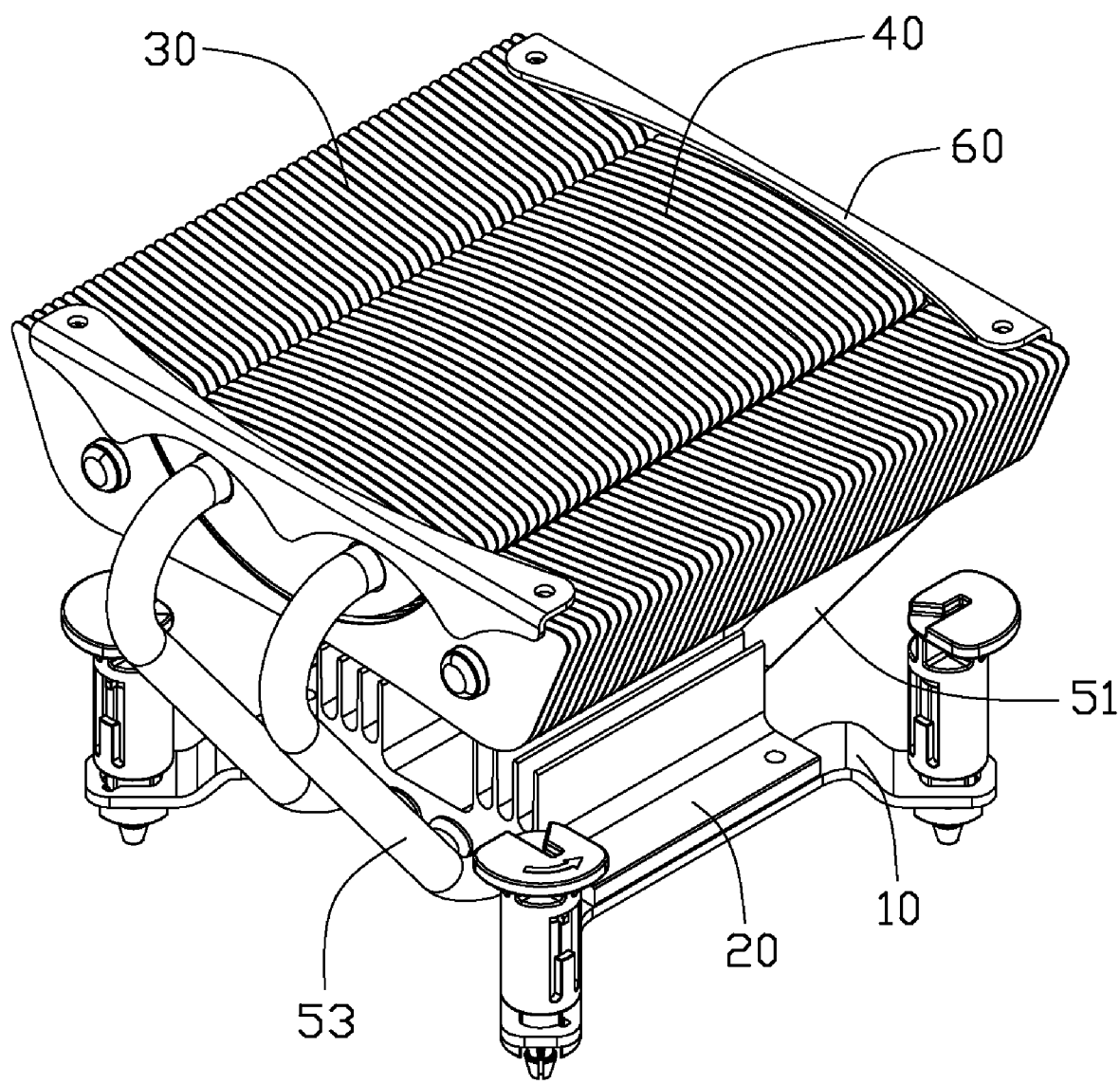
FIG. 3 is a partially assembled view of the heat dissipation device of FIG. 1
Figure 4:
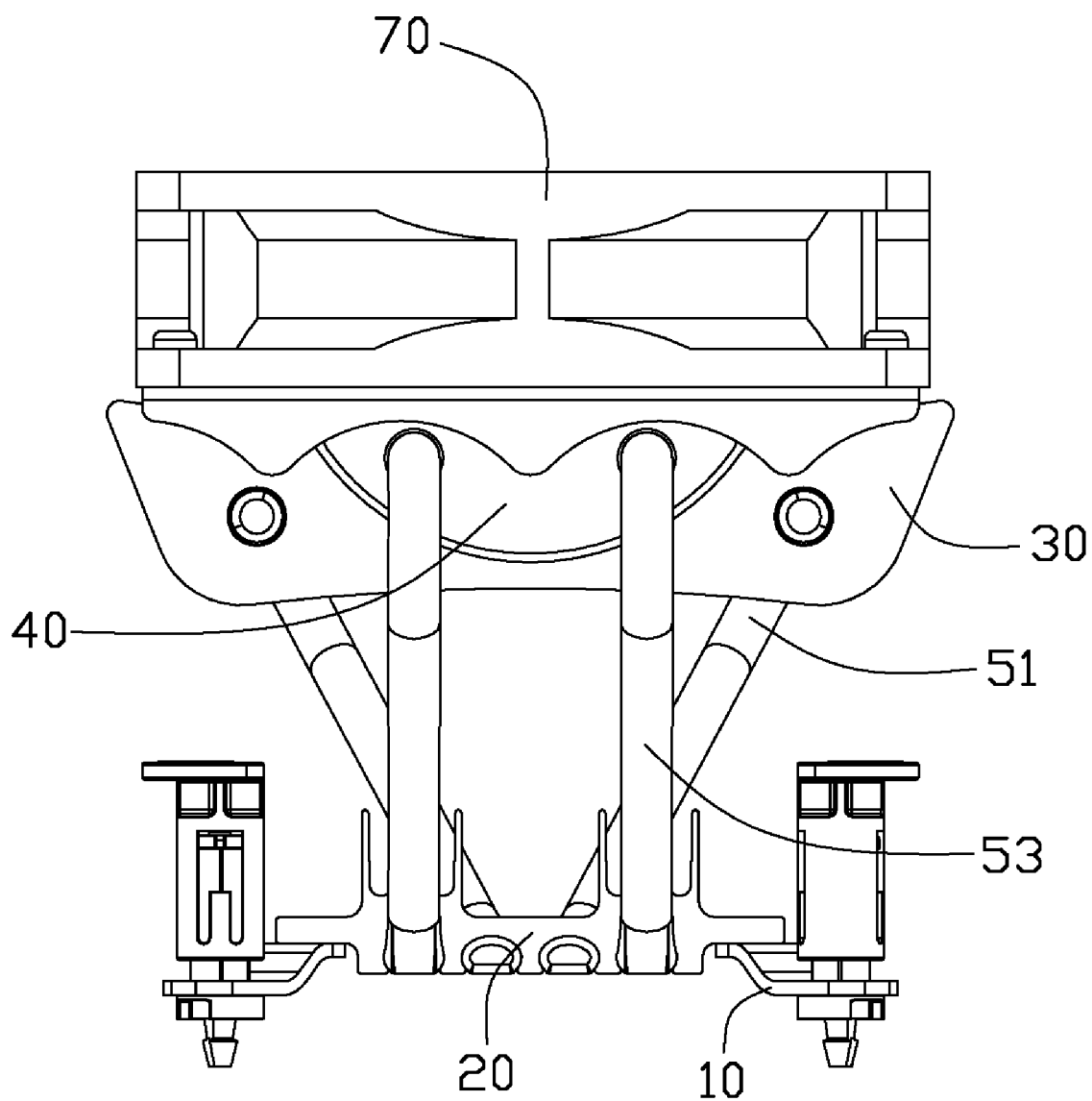
FIG. 4 is an assembled view of FIG. 1.

Referring to FIGS. 3-4, in assembly, the condensing portions 513 of the first heat pipes 51 extend through the through holes 315 of the first fin group 30 from the front side to the rear side of the fin group and the evaporating portions 511 of the first heat pipes 51 are received in the grooves 27 located at the centre of the base 20; simultaneously, the condensing portions 533 of the second heat pipes 53 extend through the through holes 415 of the second fin group 40 from the rear side to the front side of the fin group and the evaporating portions 531 of the second heat pipes 53 are received in the grooves 27 located at the lateral sides of the base 20. In this state, the first fin group 30 is located above the top of the base 20 and spaced from the base 20. The connecting portions 515 of the first heat pipes 51 are located at the front side of the fin group. The first fin group 30 is supported by the condensing portions 513 and the connecting portions 515 of the first heat pipes 51. The second fin group 40 is received in and spaced from the cupped portion 313 of the first fin group 30 and an arc-shaped channel is defined between the first and second fin groups 30, 40. The connecting portions 535 of the second heat pipes 53 are located at the rear side of the fin group. The second fin group 40 is supported by the condensing portions 533 and the connecting portions 535 of the second heat pipes 53. The evaporating portions 511 of the first heat pipes 51 are located between the evaporating portions 531 of the second heat pipes 53. The condensing portions 533 of the second heat pipes 53 are located between the condensing portions 513 of the first heat pipes 51. The poles 6311 of the mounting plates 63 of the fan holders 60 extend through the mounting holes 317, 417 of the first and second fin groups 30, 40 to mount the fan holders 60 on the fin group. The screws extend through the mounting holes 731 of the fan 70 and the mounting holes 611 of the fan holders 60 to mount the fan 70 on the fan holders 60. The locking members 10 are mounted on the printed circuit board.

In use, the evaporating portions 511 of the first heat pipes 51 absorb a majority of heat generated by the electronic component and transfer to a lateral sides of first fin group 30. Airflow generated by the fan 70 focused on the lateral sides of first fin group 30 takes away heat generated by the electronic component.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device adapted for dissipating heat generated by an electronic component mounted on a printed circuit board, comprising:
    a base adapted for thermally contacting the electronic component;
    a fin group located at a top of the base;
    a fan mounted on a top of the fin group; and
    a pair of first heat pipes and a pair of second heat pipes connecting with the base and the fin group, the first and second heat pipes each comprising a condensing portion and an evaporating portion, the evaporating portions of the first and second heat pipes received in the base, the condensing portions of the first and the second heat pipes located at opposite sides of the fin group respectively and extending through and supporting the fin group along opposite directions, the evaporating portions of the first heat pipes located between the evaporating portions of the second heat pipes, the condensing portions of the second heat pipes located between the condensing portions of the first heat pipes.

2. The heat dissipation device as claimed in claim 1, wherein the first and second heat pipes each comprise a connecting portion connecting with the evaporating portion and the condensing portion, and the connecting portions of the first and second heat pipes are located at the opposite sides of the fin group.

3. The heat dissipation device as claimed in claim 2, wherein the condensing portion of each of the first and second heat pipes is longer than the evaporating portion of the respective first or second heat pipe.

4. The heat dissipation device as claimed in claim 2, wherein the evaporating portions of the first and second heat pipes and the bottom surface of the base are coplanar.

5. The heat dissipation device as claimed in claim 2, wherein the first and second heat pipes each have a U-shaped configuration.

6. The heat dissipation device as claimed in claim 1, wherein the fin group comprises a first fin group and a second fin group, the condensing portion of the first heat pipe extending through the first fin group from a front side to a rear side of the fin group, and the condensing portion of the second heat pipe extending through the second fin group from a rear side to a front side of the fin group.

7. The heat dissipation device as claimed in claim 6, wherein the first fin group defines a cupped portion at a top portion thereof, the second fin group received in the cupped portion of the first fin group.

8. The heat dissipation device as claimed in claim 6, further comprising a fan holder, the fan holder mounted on a front side of the fin group and connecting with the first and second fin groups.

9. The heat dissipation device as claimed in claim 1, wherein the distance between the condensing portions of the second heat pipes is equal to the distance between the evaporating portions of the second heat pipes.

10. The heat dissipation device as claimed in claim 9, wherein each of the first heat pipes comprises a connecting portion interconnecting with the condensing portion and the evaporating portion thereof and each of the second heat pipes comprises a connecting portion interconnecting the condensing portion and the evaporating portion thereof, the connecting portions of the first and second heat pipes located at opposite sides of the fin group.

11. A heat dissipation device, comprising:
a heat spreader having a top surface and a bottom surface, a plurality of fins extending from the top surface of the heat spreader;
a fin group located above the heat spreader;
a pair of first heat pipes having two adjoining evaporating portions embedded in the heat spreader at the bottom surface and two spaced condensing portions extending through the fin group from a rear side of the fin group; and
a pair of second heat pipes having two evaporating portions embedded in the heat spreader at the bottom surface and located at two flanks of the evaporating portions of the first heat pipes, and two condensing portions located between the condensing portions of the first heat pipes and extending through the fin group from a front side of the fin group.

12. The heat dissipation device as claimed in claim 11, wherein the first and second heat pipes respectively comprise two connecting portions interconnecting the evaporating and condensing portions thereof, the connecting portions of the first and second heat pipes located at two opposite rear and front sides of the fin group.

13. The heat dissipation device as claimed in claim 11, wherein a bottom of the fin group is spaced from a top of the fins of the heat spreader.

14. The heat dissipation device as claimed in claim 11, wherein the fin group comprises a first fin group having a receiving chamber, and a second fin group received in the receiving chamber of the first fin group.

15. The heat dissipation device as claimed in claim 11, further comprising a pair of fan holders mounted on the front and rear sides of the fin group to mount a fan on the fin group.

16. A heat dissipation device adapted for dissipating heat generated by an electronic component mounted on a printed circuit board, comprising:
a base adapted for thermally contacting the electronic component;
a fin group located at a top of the base, the fin group comprising a first fin group and a second fin group, the first fin group defining a cupped portion at a top portion thereof, the second fin group being received in the cupped portion of the first fin group;
a fan mounted on a top of the fin group; and
a first heat pipe and a second heat pipe connecting with the base and the fin group, the first and second heat pipe each comprising a condensing portion and an evaporating portion, the evaporating portions of the first and second heat pipes received in the base, the condensing portions of the first and the second heat pipes located at opposite sides of the fin group respectively and extending through and supporting the fin group along opposite directions, the condensing portion of the first heat pipe extending through the first fin group from a front side to a rear side of the fin group, and the condensing portion of the second heat pipe extending through the second fin group from a rear side to a front side of the fin group.

17. The heat dissipation device as claimed in claim 16, wherein the first and second heat pipes each comprise a connecting portion connecting with the evaporating portion and the condensing portion, and the connecting portions of the first and second heat pipes are located at the opposite sides of the fin group.

18. The heat dissipation device as claimed in claim 17, wherein the condensing portion of each of the first and second heat pipes is longer than the evaporating portion of the respective first or second heat pipe.

19. The heat dissipation device as claimed in claim 17, wherein the evaporating portions of the first and second heat pipes and the bottom surface of the base are coplanar.

20. The heat dissipation device as claimed in claim 17, wherein the first and second heat pipes each have a U-shaped configuration.

* * * * *